(12) United States Patent
Lee

(10) Patent No.: US 10,283,189 B2
(45) Date of Patent: May 7, 2019

(54) SEMICONDUCTOR DEVICE AND MEMORY SYSTEM HAVING INPUT BUFFER CIRCUIT

(71) Applicant: SK hynix Inc., Gyeonggi-do (KR)

(72) Inventor: Seung Ho Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/860,778

(22) Filed: Jan. 3, 2018

(65) Prior Publication Data

US 2018/0342280 A1    Nov. 29, 2018

(30) Foreign Application Priority Data

May 26, 2017    (KR) .................... 10-2017-0065427

(51) Int. Cl.

| G11C 5/14 | (2006.01) |
|---|---|
| G11C 11/4078 | (2006.01) |
| H03K 17/081 | (2006.01) |
| G11C 11/4074 | (2006.01) |
| G11C 11/4099 | (2006.01) |
| G11C 11/4093 | (2006.01) |
| G11C 7/02 | (2006.01) |
| G11C 7/10 | (2006.01) |
| G11C 11/408 | (2006.01) |

(52) U.S. Cl.
CPC ........... *G11C 11/4078* (2013.01); *G11C 7/02* (2013.01); *G11C 7/1084* (2013.01); *G11C 11/4074* (2013.01); *G11C 11/4093* (2013.01); *G11C 11/4099* (2013.01); *H03K 17/08104* (2013.01); *G11C 11/4087* (2013.01)

(58) Field of Classification Search
CPC .. G11C 5/066; G11C 8/20; G11C 7/24; G11C 5/143; G11C 7/065; G11C 5/141; G11C 11/4074; G11C 15/046; G11C 16/0483; G11C 16/08; G11C 16/24; G11C 16/26
USPC ........................ 365/177, 185.12, 203, 51, 63
See application file for complete search history.

(56) References Cited

U.S. PATENT DOCUMENTS

| 5,646,809 | A | 7/1997 | Motley et al. |
|---|---|---|---|
| 7,932,748 | B1 | 4/2011 | Ker et al. |
| 2005/0286333 | A1* | 12/2005 | Gupta .............. H03K 19/00315 365/226 |

FOREIGN PATENT DOCUMENTS

| KR | 200269718 | 3/2002 |
|---|---|---|
| KR | 100519788 | 10/2005 |

OTHER PUBLICATIONS

Ker, M. et al., Design of 2xVDD-Tolerant I/O Buffer with 1xVDD CMOS Devices, IEEE, pp. 539-542, 2009.

(Continued)

*Primary Examiner* — Thong Q Le

(74) *Attorney, Agent, or Firm* — IP & T Group LLP

(57) ABSTRACT

Provided is an input buffer circuit comprising a high-voltage protection unit coupled to a pad and comprising a low-voltage pass unit and a high-voltage pass unit that are coupled in common to an output signal node. The low-voltage pass unit may transfer the first voltage to the output signal node, when a first voltage falling within a first voltage range is applied through the pad. The high-voltage pass unit may transfer a third voltage lower than the second voltage to the output signal node, when a second voltage falling within a second voltage range higher than the first voltage range is applied through the pad.

20 Claims, 12 Drawing Sheets

(56) References Cited

OTHER PUBLICATIONS

Ker, M. et al., Design on Mixed-Voltage I/O Buffer With Blocking NMOS and Dynamic Gate-Controlled Circuit for High-Voltage-Tolerant Applications, IEEE, pp. 1859-1862, 2005.
Zhang, J. et al., A Novel Input/Output Interface Circuit with High Voltage Tolerant and PCI Compliant Capabilities, IEEE, 2010.

* cited by examiner

| VOLTAGE DIFFERENCE | RELIABLE OPERATING VOLTAGE RANGE |
|---|---|
| $V_{gd}$ (Gate-Drain) | $V_{gd} \leq VDDO+a1$ |
| $V_{gs}$ (Gate-Source) | $V_{gs} \leq VDDO+a2$ |
| $V_{ds}$ (Drain-Source) | $V_{ds} \leq VDDO+a3$ |

| PIN | Definition | Description | |
|---|---|---|---|
| IE | Input Enable | 0 | Input Disable |
| | | 1 | Input Enable |
| VSEL | Voltage Selection | 0 | INPUT SIGNAL SWING = HV |
| | | 1 | INPUT SIGNAL SWING = LV |
| Truth Table | | | |
| IE | VSEL | CIEV | |
| 0 | 0/1 | 0 | |
| 1 | 0 | 0 | |
| 1 | 1 | 1 | |

SEMICONDUCTOR DEVICE AND MEMORY SYSTEM HAVING INPUT BUFFER CIRCUIT

CROSS-REFERENCE TO RELATED APPLICATION

The present application claims priority to Korean patent application number 10-2017-0065427 filed on May 26, 2017, which is incorporated herein by reference in its entirety.

BACKGROUND

1. Field of Invention

Various embodiments of the present disclosure generally relate to a semiconductor device and an electronic system having an input buffer circuit. Particularly, various embodiments of the present disclosure relate to an input buffer circuit for stable operation of a semiconductor device or an electronic system when a high-voltage signal is inputted to the semiconductor device or the electronic system.

2. Description of Related Art

The supply voltage of a semiconductor device has gradually decreased with the development of process technology. However, the supply voltage of a system to which such a semiconductor device is applied has generally been equal to or higher than the supply voltage of the semiconductor device. Therefore, the input buffer circuit of a semiconductor device need to be stably operated even when an input signal has a wide voltage range.

Generally, the input buffer circuit of a semiconductor device denotes an input buffer that is coupled to a pad to buffer an external signal applied through the pad. In particular, when the input signal applied from an external device has a voltage higher than the supply voltage of the input buffer circuit of the semiconductor device, the reliability of transistors in the input buffer circuit may deteriorate or, alternatively, a large amount of leakage current may occur during the operation of the input buffer circuit, thus resulting in the malfunctioning of the semiconductor device.

Consequently, there is a need for an input buffer circuit that is capable of stably operating even when an external input signal having a wide voltage range is received.

SUMMARY

Various embodiments of the present disclosure are directed to a semiconductor device and an electronic system having an input buffer circuit, which may improve the reliability of the electronic system.

In accordance with one embodiment of the present disclosure, an input buffer circuit may include a high-voltage protection unit coupled to a pad and comprising a low-voltage pass unit and a high-voltage pass unit that are coupled in common to an output signal node. The low-voltage pass unit may transfer the first voltage to the output signal node, when a first voltage falling within a first voltage range is applied through the pad. The high-voltage pass unit may transfer a third voltage lower than the second voltage to the output signal node, when a second voltage falling within a second voltage range higher than the first voltage range is applied through the pad.

In accordance with one embodiment of the present disclosure, a memory system may include an input buffer circuit configured to receive an input signal from a host through a pad. The input buffer circuit may include a high-voltage protection unit and a well voltage generation unit that use an input stage supply voltage as a supply voltage. The high-voltage protection unit may output the input stage supply voltage when a voltage of the input signal is a first voltage higher than the supply voltage, and the well voltage generation unit may variably control a well voltage of at least one first-type transistor included in the high-voltage protection unit based on the voltage of the input signal.

In accordance with one embodiment of the present disclosure, a semiconductor device may include an input buffer circuit configured to receive an input signal from an external device through a pad and comprising a high-voltage pass unit, a low-voltage pass unit, and a ground-voltage pass unit that are coupled in common to an output signal node. The high-voltage pass unit may, when a voltage of the input signal falls within a first voltage range, output a protection voltage lower than the first voltage to the output signal node. The low-voltage pass unit may, when the voltage of the input signal falls within a second voltage range lower than the first voltage range, transfer the input signal to the output signal node. The ground-voltage pass unit may, when the voltage of the input signal falls within a third voltage range lower than the second voltage range, transfer the input signal to the output signal node.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art.

It will be understood that when an element is referred to as being "coupled" or "connected" to another element, it can be directly coupled or connected to the other element or intervening elements may be present therebetween. In the specification, when an element is referred to as "comprising" or "including" a component, it does not exclude other components but may further include other components unless a description to the contrary is specifically pointed out in context.

Figure 1:
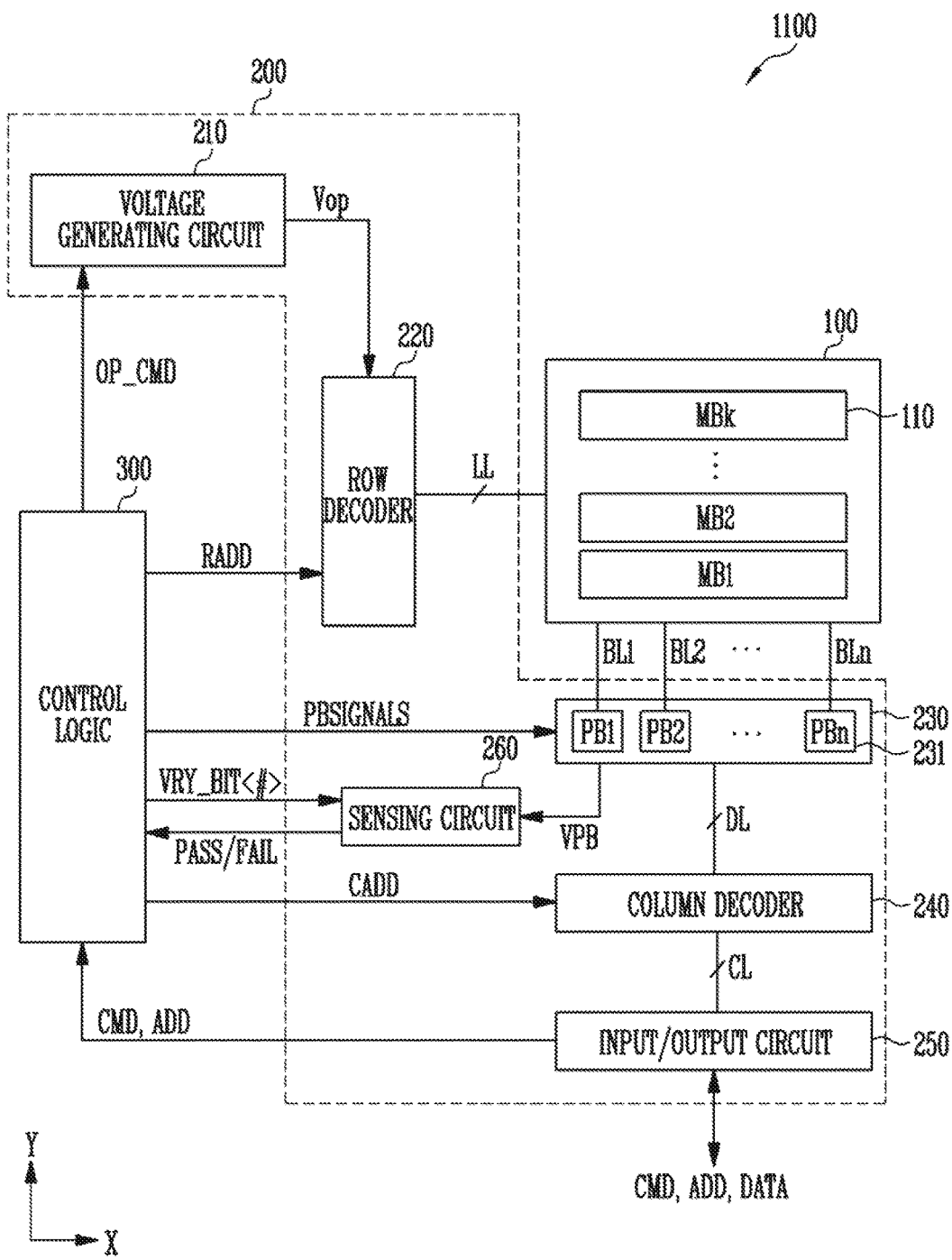
FIG. 1 is a diagram illustrating a memory device according to an embodiment of the present disclosure.

FIG. 1 is a diagram illustrating a memory device according to an embodiment of the present disclosure.

Referring to FIG. 1, a memory device 1100 may include a memory cell array 100 in which data is stored. The memory device 1100 may also include peripheral circuits 200, which perform a program operation for storing data in the memory cell array 100, a read operation for outputting stored data, and an erase operation for erasing stored data. The memory device 1100 may include a control logic 300, which controls the peripheral circuits 200 under the control of a memory controller (not illustrated).

The memory cell array 100 may include a plurality of memory blocks MB1 to MBk 110 (where k is a positive integer). Local lines LL and bit lines BL1 to BLn (where n is a positive integer) may be coupled to each of the memory blocks MB1 to MBk 110. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines. In another example, the local lines LL may further include dummy lines. In yet another example, the local lines LL may further include pipelines. The local lines LL may be coupled to the memory blocks MB1 to MBk 110, respectively, and the bit lines BL1 to BLn may be coupled in common to the memory blocks MB1 to MBk 110. The memory blocks MB1 to MBk 110 may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may perform a program, read or erase operation on a selected memory block 110 under the control of the control logic 300. For example, the peripheral circuits 200 may supply a verify voltage and pass voltages to the first select line, the second select line, and the word lines, may selectively discharge the first select line, the second select line, and the word lines, and may verify memory cells coupled to a word line selected from among the word lines, under the control of the control logic 300. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read and erase operations in response to an operation signal OP_CMD. Further, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, etc. under the control of the control logic 300.

The row decoder 220 may transfer the operating voltages Vop to the local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may be operated in response to page buffer control signals PBSIGNALS. For example, the page buffers PB1 to PBn 231 may temporarily store data received through the bit lines BL1 to BLn or may sense the voltages or currents of the bit lines BL1 to BLn during a read or a verify operation.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transfer a command CMD and an address ADD received from the memory controller (not illustrated) to the control logic 300, or may exchange data DATA with the column decoder 240.

The sensing circuit 260 may generate a reference current in response to an enable bit VRY_BIT<#> and may output a pass signal PASS or a fail signal FAIL by comparing a sensing voltage VPB that is received from the page buffer group 230, with a reference voltage that is generated based on the reference current, during the read operation or the verify operation.

The control logic 300 may control the peripheral circuits 200 by outputting the operation signal OP_CMD, the row address RADD, the page buffer control signals PBSIGNALS, and the enable bit VRY_BIT<#> in response to the command CMD and the address ADD. Further, the control logic 300 may determine whether a verify operation has passed or failed in response to the pass or fail signal PASS or FAIL.

Figure 2:
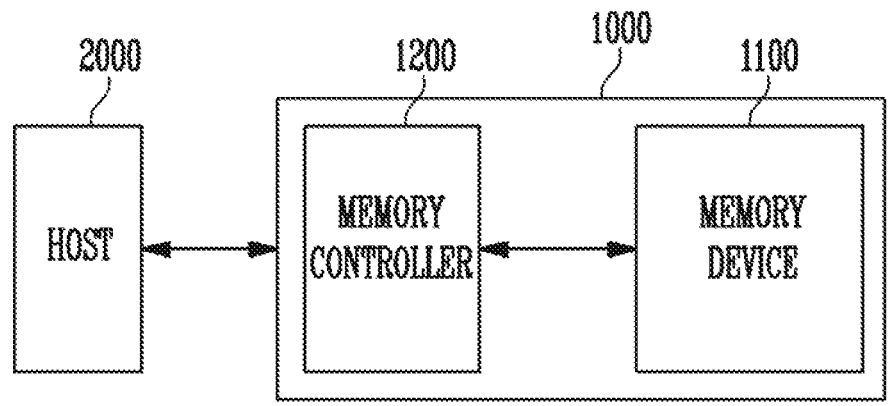
FIG. 2 is a diagram illustrating a memory system according to an embodiment of the present disclosure.

FIG. 2 is a diagram illustrating a memory system according to an embodiment of the present disclosure.

Referring to FIG. 2, a memory system 1000 may include a memory device 1100 in which data is stored, and a memory controller 1200 for controlling the memory device 1100 under the control of a host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The memory controller 1200 may control the overall operation of the memory system 1000 and also control data exchange between the host 2000 and the memory device 1100. For example, the memory controller 1200 may program or read data by controlling the memory device 1100 in response to a request from the host 2000. Further, the memory controller 1200 may store information of main memory blocks and sub-memory blocks included in the memory device 1100 and may select the memory device 1100 so that a program operation is performed on a main memory block or a sub-memory block depending on the amount of data loaded for the program operation. In accordance with an embodiment, the memory device 1100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM) or a flash memory. However, the memory device 1100 is not limited to the above-mentioned examples and may include any suitable type of semiconductor device such as a data processor, a micro-control unit, an electronic sensor, and a telecommunication chip.

The memory device 1100 may perform a program operation, a write operation, a read operation, or an erase operation under the control of the memory controller 1200.

Figure 3:
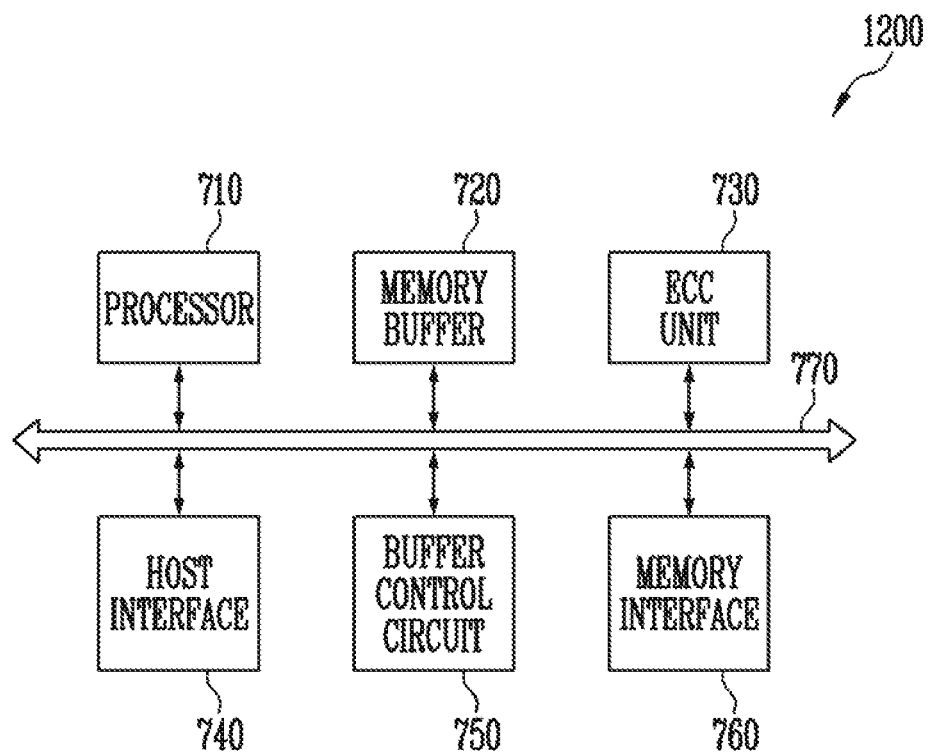
FIG. 3 is a diagram illustrating a memory controller of FIG. 2.

FIG. 3 is a diagram illustrating the memory controller of FIG. 2.

Referring to FIG. 3, the memory controller 1200 may include a processor 710, a memory buffer 720, an error correction code (ECC) unit 730, a host interface 740, a buffer control circuit 750, a memory interface 760, and a bus 770.

The bus 770 may provide a channel between the components of the memory controller 1200.

The processor 710 may control the overall operation of the memory controller 1200 and may perform a logical operation. The processor 710 may communicate with an external host 2000 through the host interface 740, and also communicate with the memory device 1100 through the memory interface 760. Further, the processor 710 may communicate with the memory buffer 720 through the buffer control circuit 750. The processor 710 may control the operation of the memory system 1000 using the memory buffer 720 as a working memory, a cache memory, or a buffer memory.

The memory buffer 720 may be used as the working memory, the cache memory, or the buffer memory of the processor 710. The memory buffer 720 may store codes and commands that are executed by the processor 710. The memory buffer 720 may store data that is processed by the processor 710. The memory buffer 720 may include a Static RAM (SRAM) or a Dynamic RAM (DRAM).

The ECC unit 730 may perform error correction. The ECC unit 730 may perform ECC encoding based on data to be written to the memory device 1100 through the memory interface 760. The ECC-encoded data may be transferred to the memory device 1100 through the memory interface 760. The ECC unit 730 may perform ECC decoding on the data received from the memory device 1100 through the memory interface 760. In an embodiment, the ECC unit 730 may be included in the memory interface 760 as the component of the memory interface 760.

The host interface 740 may communicate with the external host 2000 under the control of the processor 710. The host interface 740 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-Volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 750 may control the memory buffer 720 under the control of the processor 710.

The memory interface 760 may communicate with the memory device 1100 under the control of the processor 710. The memory interface 760 may transmit/receive commands, addresses, and data to/from the memory device 1100 through the channel.

As an example, the memory controller 1200 may not include the memory buffer 720 and the buffer control circuit 750.

As an example, the processor 710 may control the operation of the memory controller 1200 using codes. The processor 710 may load codes from a nonvolatile memory device (e.g., read only memory: ROM) provided in the memory controller 1200. As an example, the processor 710 may load codes from the memory device 1100 through the memory interface 760.

In an embodiment, the bus 770 of the memory controller 1200 may be classified into a control bus and a data bus. The data bus may be configured to transmit data within the memory controller 1200, and the control bus may be configured to transmit control information such as commands and addresses within the memory controller 1200. The data bus and the control bus may be isolated from each other, and may neither interfere with each other nor influence each other. The data bus may be coupled to the host interface 740, the buffer control circuit 750, the ECC unit 730, and the memory interface 760. The control bus may be coupled to the host interface 740, the processor 710, the buffer control circuit 750, the memory buffer 720, and the memory interface 760.

Figure 4:
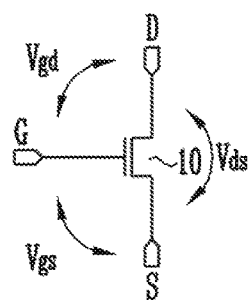
FIG. 4 is a diagram for describing a reliable operating voltage range of a transistor.

FIG. 4 is a diagram for describing reliable operating voltage ranges of a transistor.

Referring to FIG. 4, when a high voltage is applied to the gate G, drain D, and source S of a transistor 10, the reliability of the transistor may deteriorate. In other words, when the gate-drain voltage difference Vgd, gate-source voltage difference Vgs, and drain-source voltage difference Vds are increased to a certain voltage or more, error may occur during the operation of the transistor 10. Such error may result from the breakdown of the gate oxide of the transistor 10.

Therefore, the transistor 10 may be controlled such that the gate-drain voltage difference Vgd, the gate-source voltage difference Vgs, and the drain-source voltage difference Vds are less than or equal to a certain voltage. In an embodiment, the reliability of the transistor 10 may be guaranteed only when the gate-drain voltage difference Vgd is controlled to be less than or equal to a voltage (VDDO+a1) that is slightly higher than an input stage supply voltage. Further, the reliability of the transistor 10 may be guaranteed only when the gate-source voltage difference Vgs and the drain-source voltage difference Vds are controlled to be less than or equal to VDDO+a2 and VDDO+a3, respectively. Here, a1, a2, and a3 may be the same value according to one exemplary embodiment.

The input stage supply voltage VDDO used in the recent memory device 1100 or memory system 1000 may typically be a voltage of about 1.8 V, for instance. This voltage tends to gradually decrease with the development of semiconductor processing technology. The input stage supply voltage may be set differently depending on the applications of the memory device 1100 or the memory system 1000. Typically, each of the above-described variables a1, a2, and a3 may be a voltage corresponding to about 10% of the input stage supply voltage VDDO. In an embodiment, when the input stage supply voltage VDDO is 1.8 V, a1, a2, and a3 may each be 0.18 V. In other words, when the input stage supply voltage VDDO is 1.8 V, the reliability of the operation of the transistor 10 may be guaranteed when the gate-drain voltage difference Vgd, the gate-source voltage difference Vgs, and the drain-source voltage difference Vds of the transistor 10 are controlled to be 1.98 V or less.

Figure 5:
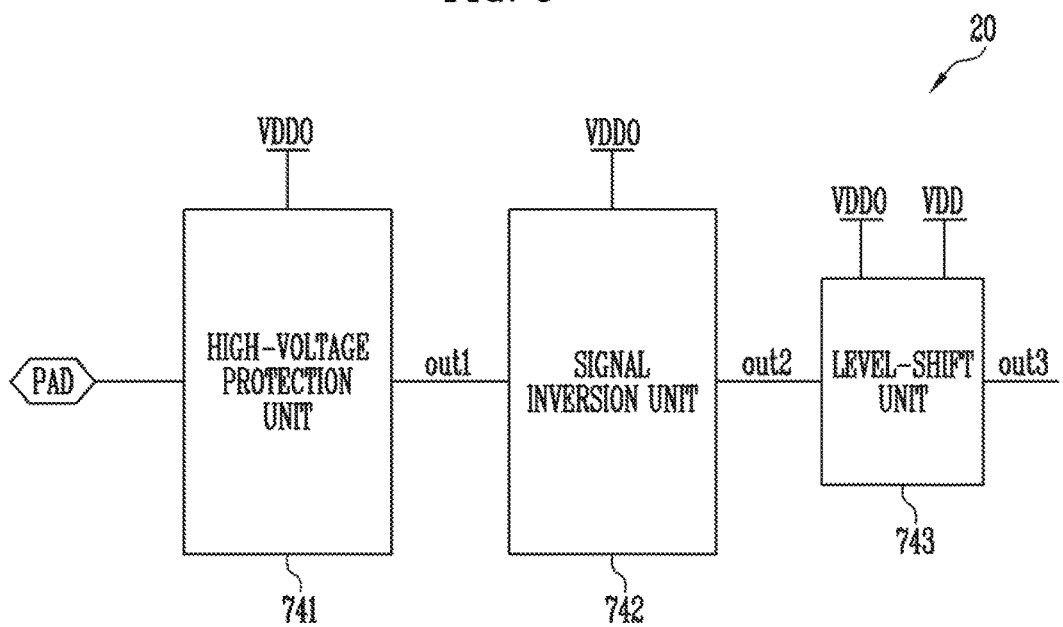
FIG. 5 is a block diagram illustrating an input buffer circuit.

FIG. 5 is a block diagram for describing the input buffer circuit.

The input/output circuit 250 of FIG. 1 or the host interface 740 of FIG. 3 may receive a signal from an external device or a host 2000 through a pad PAD. This signal may be a control signal such as a command and an address, or a data signal. The voltage of the input signal applied through the pad PAD may be identical to or different from an input stage supply voltage VDDO or an internal supply voltage VDD. In actual usage environments, there may be a number of cases where the supply voltage of a system in which the memory device 1100 or the memory system 1000 is used is different from the input stage supply voltage VDDO of the memory device 1100 or the memory system 1000. As an example, the input stage supply voltage VDDO used in the input/output circuit 250 or the host interface 740 may be 1.8 V, and the input signal applied through the pad may be inputted with a voltage swing of 1.8 V. The fact that the input signal has a voltage swing of 1.8 V means that the voltage range of the input signal falls within a range from 0 V to 1.8 V. In other words, when the input signal is low, a voltage of 0 V is applied, whereas when the input signal is high, a voltage of 1.8 V is applied. As another example, when the input signal applied through the pad is high, the input signal may be inputted with a voltage higher than the input stage supply voltage VDDO. In other words, the input signal applied through the pad may be inputted with a voltage swing of 3.3 V. When the signal is low, a voltage of 0 V may be applied to the pad, whereas when the signal is high, a voltage of 3.3 V may be applied to the pad.

The magnitude of the voltage swing of the input signal may differ depending on the applications of the memory device 1100 or the memory system 1000. For example, a Universal Serial Bus (USB) protocol uses various voltages depending on the version of the protocol in such a way that the magnitude of the swing of the input signal is 3.3 V or 1.8 V. In order to secure the reliability of the memory device 1100 or the memory system 1000 that may receive the input signal having such a wide voltage range, the input/output circuit 250 of FIG. 1 or the host interface 740 of FIG. 3 may include an input buffer circuit 20. The input buffer circuit 20 should be designed such that the reliability of transistors included in the input buffer circuit 20 can be protected when a high voltage is applied from the pad. In addition, the input buffer circuit 20 needs to be designed such that it is applicable to all of the voltage swings of various input signals.

Referring to FIG. 5, the input buffer circuit 20 may include a high-voltage protection unit 741, a signal inversion unit 742, and a level-shift unit 743.

The high-voltage protection unit 741 may use an input stage supply voltage VDDO as a supply voltage. The high-voltage protection unit 741 may protect the reliability of transistors included in the high-voltage protection unit 741 when a voltage higher than the input stage supply voltage VDDO is applied to the pad. As described above with reference to FIG. 4, in order to guarantee the reliability of operations of the transistors, the gate-drain voltage difference Vgd, the gate-source voltage difference Vgs, and the drain-source voltage difference Vds of each transistor may be controlled such that they are set to a certain voltage or less. In other words, when a high voltage such as the voltage of 3.3 V is applied to the pad, error may occur during the transistor's operation because the gate-drain voltage difference Vgd, the gate-source voltage difference Vgs, and the drain-source voltage difference Vds of the transistor may be 3.3 V, which is much higher than the input stage supply voltage VDDO (i.e., 1.8 V). Therefore, when 3.3 V is applied to the pad, the gate-drain voltage difference Vgd, the gate-source voltage difference Vgs, and the drain-source voltage difference Vds of the transistor need to be controlled such that they are less than or equal to 1.98 V, as described above with reference to FIG. 4.

When a high voltage is applied to the pad, the high-voltage protection unit 741 may convert the high voltage into a low voltage that can secure the reliability of transistors, and may transfer the low voltage to the signal inversion unit 742. In other words, a first output signal out1 may be a signal that is converted into a lower voltage from a high voltage when the high voltage is applied through the pad.

The signal inversion unit 742 may use the input stage supply voltage VDDO as a supply voltage. The signal inversion unit 742 may convert the first output signal out1, which is received from the high-voltage protection unit 741, into a signal having a voltage swing of the input stage supply voltage VDDO, and may transfer the signal to the level-shift unit 743. For example, when the input stage supply voltage VDDO is 1.8 V, and a signal having a voltage swing of 3.3 V is inputted to the pad, the high-voltage protection unit 741 may generate a first output signal out1 that is converted to have a voltage swing lower than 3.3 V from the input signal, and may transfer the first output signal out1 to the signal inversion unit 742. The magnitude of the voltage swing of the first output signal out1 should be at a level that can secure the reliability of the transistors in the signal inversion unit 742. Further, the signal inversion unit 742 may transfer a second output signal out2, which is converted from the first output signal out1 to have the voltage swing of the input stage supply voltage VDDO, that is, a voltage swing of 1.8 V, to the level-shift unit 743. The second output signal out2 may be a signal having the swing of the input stage supply voltage VDDO regardless of the voltage range of the signal inputted to the pad.

The first output signal out1, which is outputted from the high-voltage protection unit 741, may be required not to generate a leakage current during the operation of the transistors included in the signal inversion unit 742. A detailed description thereof is made below.

The level-shift unit 743 may use the input stage supply voltage VDDO and the internal supply voltage VDD as the supply voltage. The level-shift unit 743 may convert the second output signal out2, which is received from the signal inversion unit 742, into a signal having the voltage swing of the internal supply voltage VDD. In other words, the second output signal out2 may be a signal having a range from 0 V to the input stage supply voltage VDDO, and the level-shift unit 743 may convert the second output signal out2 into a signal having a range from 0 V to the internal supply voltage VDD. The internal supply voltage VDD may be a voltage slightly lower than the input stage supply voltage VDDO. For example, when the input stage supply voltage VDDO is 1.8 V, the internal supply voltage VDD may be set to 1.6 V. That is, when the second output signal out2 has a voltage swing of 1.8 V, a third output signal out3 may be a signal having a voltage swing of 1.6 V.

Figure 6:
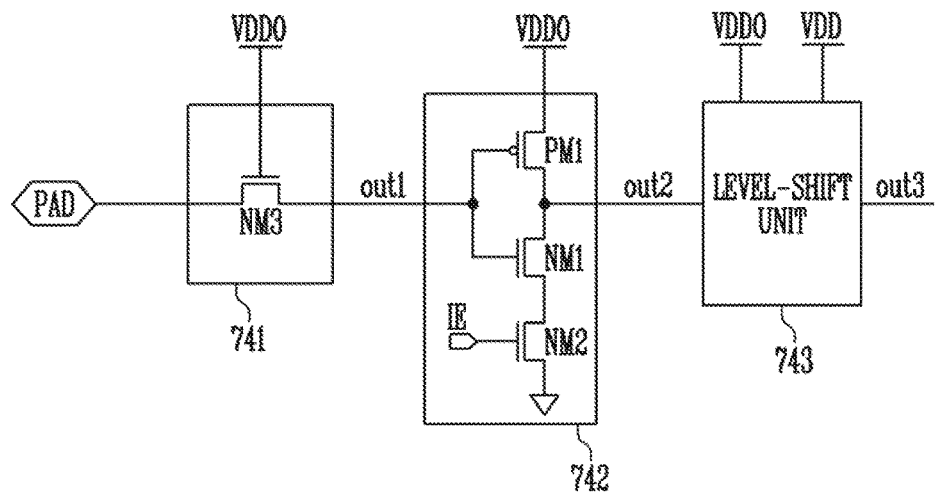
FIG. 6 is a diagram illustrating an input buffer circuit according to an embodiment of the present disclosure.

FIG. 6 is a diagram illustrating an input buffer circuit according to an embodiment of the present disclosure.

Referring to FIG. 6, the input buffer circuit 20 may include a high-voltage protection unit 741, a signal inversion unit 742, and a level-shift unit 743.

When a high voltage is applied through the pad, the high-voltage protection unit 741 generates a first output signal out1 having a voltage lower than the applied high voltage. For example, when the input stage supply voltage VDDO is 1.8 V, and the voltage applied to the pad is 3.3 V, the first output signal out1 may be set to a voltage lower than the input stage supply voltage VDDO by the threshold voltage of a third N-type transistor NM3. For example, the threshold voltage of an N-type transistor may be about 0.5 V. In this case, the first output signal out1 may be set to a voltage of about 1.3 V. That is, the gate-drain voltage difference of the third N-type transistor NM3 may be 1.5 V, and the gate-source voltage difference thereof may be the threshold voltage of the third N-type transistor NM3, that is, 0.5 V. Further, the drain-source voltage difference of the third N-type transistor NM3 may be set to 2.0 V. Consequently, when 3.3 V is applied through the pad, the third N-type transistor NM3 may fall out of its reliable operating voltage range, and may undergo malfunctioning.

When the voltage of the first output signal out1 is set to 1.3 V, a first N-type transistor NM1 of the signal inversion unit 742 may be turned on. In addition, when an input enable signal IE is high, a second N-type transistor NM2 of the signal inversion unit 742 may be turned on. The input enable signal IE may be activated to a high state while an input operation is performed, and may be deactivated to a low state when the input operation is not performed. Consequently, the second output signal out2 may make a transition to a low state, that is, a ground voltage. Here, a first P-type transistor PM1 needs to be turned off in order to prevent the occurrence of a leakage current. In general, the threshold voltage of the P-type transistor may be less than or equal to the threshold voltage of the N-type transistor. When the threshold voltage of the N-type transistor is 0.5 V, and the threshold voltage of the P-type transistor is lower than that of the N-type transistor, the source-gate voltage difference of the first P-type transistor PM1 is 0.5 V, assuming that the voltage of the first output signal out1 is set to 1.3 V, and thus the first P-type transistor PM1 may be turned on. As a result, all of the first P-type transistor PM1, the first N-type transistor NM1, and the second N-type transistor NM2 may be turned on, and thus a large amount of leakage current may be generated. Such a large amount of leakage current may cause error in the operation of the input buffer circuit 20. The first P-type transistor PM1 may be weakly turned on even when the threshold voltage of the P-type transistor is equal to that of the N-type transistor, thus causing a leakage current at a certain level.

In other words, in the input buffer circuit 20 according to an embodiment of FIG. 6, when a voltage applied from the pad is equal to or greater than a predetermined level, the voltage applied to internal transistors may fall out of their reliable operating voltage ranges or, alternatively, a large amount of leakage current may occur during the operation resulting in a malfunction.

Figure 7:
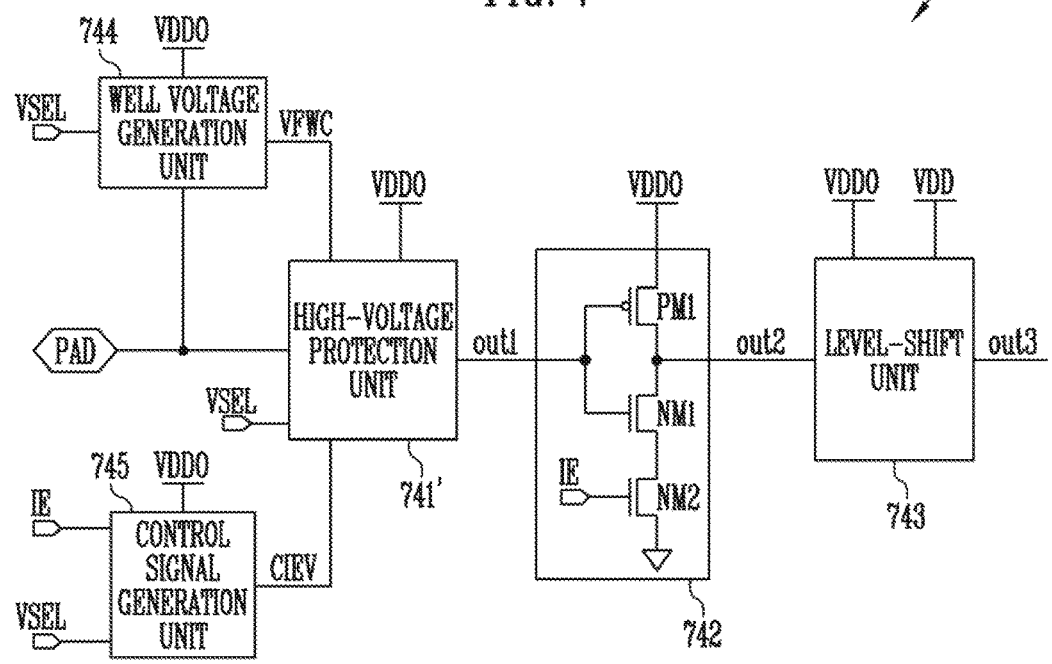
FIG. 7 is a diagram illustrating an input buffer circuit according to an embodiment of the present disclosure.

FIG. 7 is a diagram illustrating an input buffer circuit according to an embodiment of the present disclosure.

Referring to FIG. 7, an input buffer circuit 20' may include a high-voltage protection unit 741', a signal inversion unit 742, a level-shift unit 743, a well voltage generation unit 744, and a control signal generation unit 745.

The high-voltage protection unit 741' may use an input stage supply voltage VDDO as a supply voltage. The high-voltage protection unit 741' may be configured such that an internal transistor thereof is operated within a reliable operating voltage range even when a high voltage of 3.3 V is applied to a pad. Further, unlike the high-voltage protection unit 741 described above with reference to FIG. 6, the high-voltage protection unit 741' may be designed to have a voltage magnitude that prevents a first output signal out1 from producing a leakage current in the signal inversion unit 742. An exemplary circuit configuration and operation of the high-voltage protection unit 741' is described in detail below.

The well voltage generation unit 744 may generate a well control signal VFWC for variably controlling the well voltage of a P-type transistor included in the high-voltage protection unit 741' based on the voltage of an input signal that is applied to the pad. Such variable well voltage control is intended to prevent a leakage current from occurring in the high-voltage protection unit 741'. An exemplary circuit configuration and operation of the well voltage generation unit 744 is described in detail below.

The control signal generation unit 745 may generate a protection control signal CIEV for variably controlling the high-voltage protection unit 741' based on the voltage of the input signal applied to the pad and an input enable signal IE. Similarly, an exemplary configuration and operation of the control signal generation unit 745 is described in detail below.

The configuration of the signal inversion unit 742 and the level-shift unit 743 may be the same as described above with reference to FIGS. 5 and 6, and thus a detailed description thereof will be omitted.

Figures 8, 9:
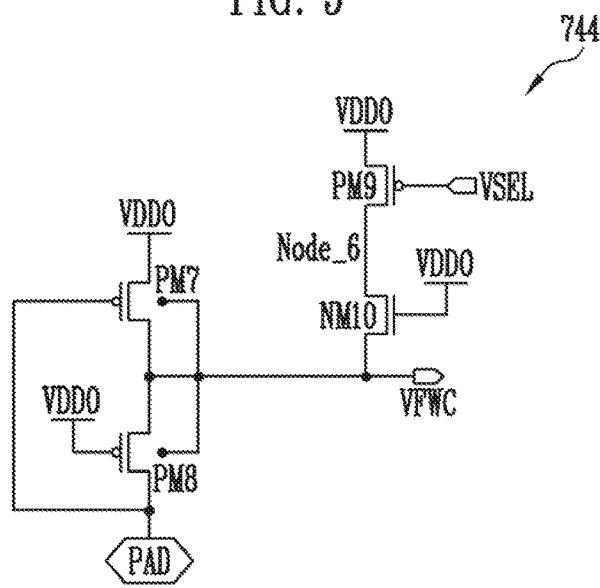
FIG. 8 is a diagram illustrating a control signal generation unit of FIG. 7.
FIG. 9 is a diagram illustrating a well voltage generation unit of FIG. 7.

FIG. 8 is a diagram illustrating the control signal generation unit of FIG. 7.

Referring to FIG. 8, an input enable signal IE may be controlled such that it has a logic high value when an input is enabled (input enable), and has a logic low value when the input is disabled (input disable). An input signal may be applied through the pad while the input is enabled.

A voltage selection signal VSEL may be controlled such that it has a logic low value when the voltage swing of the input signal applied to the pad is a high voltage (HV) swing, and has a low high value when the voltage swing of the input signal is a low voltage (LV) swing. For example, the voltage selection signal VSEL may be controlled such that it has a logic low value when the magnitude of the voltage swing of the input signal applied to the pad is 3.3 V, and has a logic high value when the magnitude of the voltage swing of the input signal is 1.8 V.

The control signal generation unit 745 may generate a protection control signal CIEV based on the input enable signal IE and the voltage selection signal VSEL. The control signal generation unit 745 may perform control such that, while the input enable signal IE is low, that is, while the input is disabled, the protection control signal CIEV has a logic low value regardless of the voltage selection signal VSEL. The control signal generation unit 745 may perform control such that, while the input enable signal IE is high, that is, while the input is enabled, the protection control signal CIEV has different values depending on the voltage selection signal VSEL. The control signal generation unit 745 may perform control such that, when the input enable signal IE is high, and the voltage selection signal VSEL is low, that is, when the input is enabled and the voltage swing of the input signal applied to the pad is a high voltage (HV) swing, the protection control signal CIEV has a logic low value. Further, the control signal generation unit 745 may perform control such that, when the input enable signal IE is high, and the voltage selection signal VSEL is high, that is, when the input is enabled and the voltage swing of the input signal applied to the pad is a low voltage (LV) swing, the protection control signal CIEV has a logic high value.

FIG. 9 is a diagram illustrating the well voltage generation unit of FIG. 7. Further, FIGS. 10 and 11 are diagrams for describing the operation of the well voltage generation unit of FIG. 9.

Figure 10:
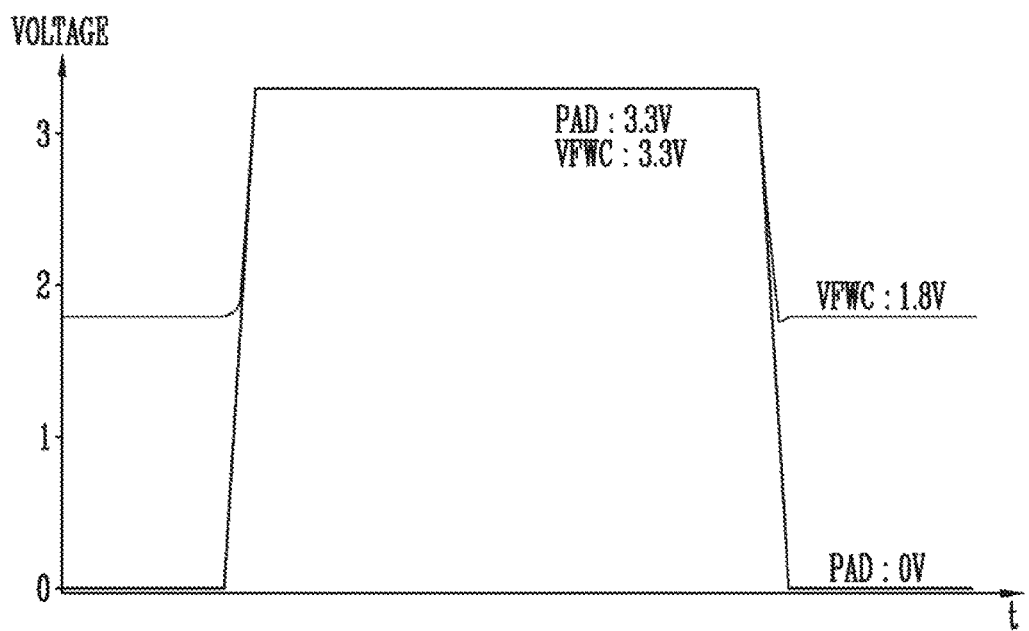
FIGS. 10 and 11 are diagrams for describing the operation of the well voltage generation unit of FIG. 7.
Figure 11:
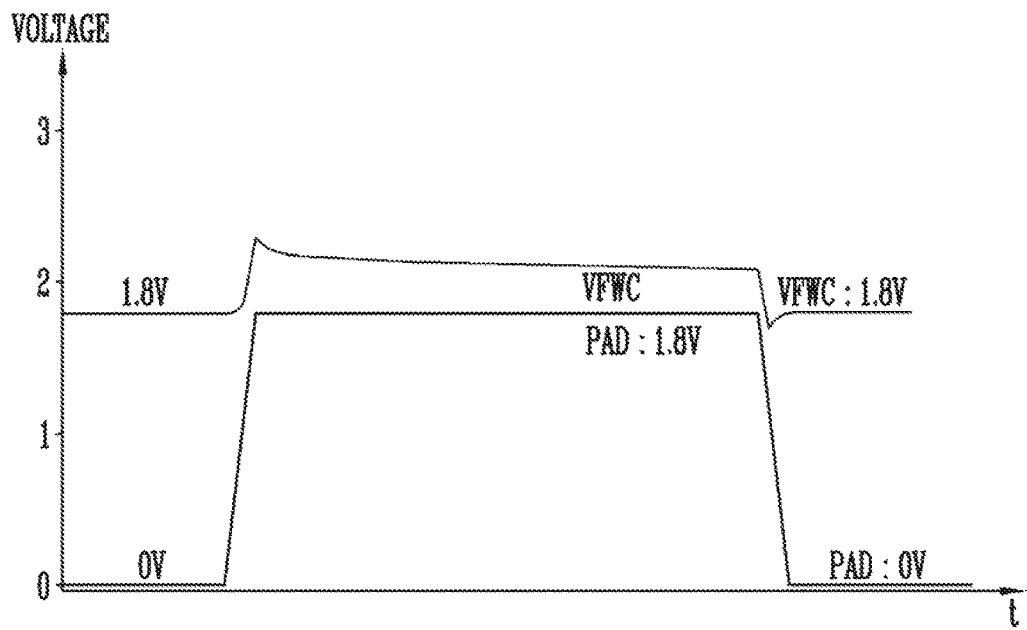

Referring to FIGS. 9 and 10, the operation of the well voltage generation unit 744, assuming that the voltage swing of an input signal applied to a pad (PAD Swing) is a high voltage (HV) swing, is illustrated. When the voltage swing of the input signal applied to the pad is a high voltage (HV) swing, a voltage selection signal VSEL may have a logic low value (e.g., 0 V), as described above with reference to FIG. 8. First, when a logic low value (e.g., 0 V) is applied through the pad, a seventh P-type transistor PM7 may be turned on, and a well control signal VFWC may be set to an input stage supply voltage VDDO. For example, when the input supply voltage VDDO is 1.8 V, if a logic low value (e.g., 0 V) is applied through the pad, the well control signal VFWC may be 1.8 V. Here, an eighth P-type transistor PM8 may be turned off, and thus a leakage current between the pad and the node of the well control signal VFWC through the eighth P-type transistor PM8 may not occur.

Since the voltage selection signal VSEL has a logic low value (e.g., 0 V) a ninth transistor PM9 may be turned on, and the voltage of a sixth node Node_6 may be set to the input stage supply voltage VDDO. Consequently, the voltages of both ends of a tenth N-type transistor NM10 may be the input stage supply voltage VDDO (e.g., 1.8 V) and, as a result, the tenth N-type transistor NM10 may be turned off. Therefore, a leakage current between the node of the input stage supply voltage VDDO and the node of the well control signal VFWC through the tenth N-type transistor NM10 and the ninth P-type transistor PM9 may not occur.

When a high voltage HV (e.g., 3.3 V) is applied through the pad, the seventh P-type transistor PM7 is turned off, but the eighth P-type transistor PM8 is turned on, and thus the well control signal VFWC may be set to a high voltage HV (e.g., 3.3 V). Here, since the voltage selection signal VSEL has a logic low value (e.g., 0 V), the ninth P-type transistor PM9 may be turned on, and the voltage of the sixth node Node_6 may be set to the input stage supply voltage VDDO. Consequently, the tenth N-type transistor NM10 may be turned off, and thus a leakage current through the tenth N-type transistor NM10 and the ninth P-type transistor PM9 may not occur.

As a result, when an input signal, the voltage swing (PAD Swing) of which is a high voltage (HV) swing, is applied to the pad, the well control signal VFWC may be set variably depending on the voltage of the input signal. That is, when a logic low value (e.g., 0 V) is applied to the pad, the well control signal VFWC may be set to the input stage supply voltage VDDO. When a logic high value (e.g., a high voltage HV), is applied to the pad, the well control signal VFWC may be set to the high voltage (HV).

Referring to FIGS. 9 and 11, the operation of the well voltage generation unit 744, assuming that the voltage swing of the input signal applied to the pad is a low voltage (LV) swing, is illustrated. First, when the voltage swing of the input signal applied to the pad is a low voltage (LV) swing, the voltage selection signal VSEL may be set to a logic high value, that is, the input stage supply voltage VDDO, as described above with reference to FIG. 8. First, when a logic low value (e.g., 0 V) is applied through the pad, the seventh type transistor PM7 may be turned on, and the well control signal VFWC may be set to the input stage supply voltage VDDO. For example, when the input stage supply voltage VDDO is 1.8 V, the well control signal VFWC may be 1.8 V if a logic low value (e.g., 0 V) is applied through the pad. Here, the eighth P-type transistor PM8 may be turned off, and thus a leakage current between the pad and the node of the well control signal VFWC through the eighth P-type transistor PM8 may not occur. Further, the ninth P-type transistor PM9 is turned off in response to the voltage selection signal VSEL, and a leakage current between the node of the input stage supply voltage VDDO and the node of the well control signal VFWC through the tenth N-type transistor NM10 and the ninth P-type transistor PM9 may not occur.

When a low voltage LV (e.g., 1.8 V) is applied through the pad, both the seventh P-type transistor PM7 and the eighth P-type transistor PM8 may be turned off. Further, in response to the voltage selection signal VSEL, the ninth P-type transistor PM9 may be turned off. Consequently, the node of the well control signal VFWC may float. That is, when a low voltage (LV) is applied through the pad, the node of the well control signal VFWC may float and may be maintained at the voltage of the well control signal VFWC that was set when 0 V is applied through the pad (e.g., at 1.8 V), or may be set to a voltage that is slightly higher than 1.8 V via voltage coupling attributable to the transition of the input voltage from 0 V to 1.8 V, as illustrated in FIG. 11.

Consequently, when the voltage swing of the input signal applied to the pad (PAD Swing) is a low voltage (LV) swing, the well control signal VFWC may be set to the input stage supply voltage VDDO or higher. That is, when a logic low value (e.g., 0 V) is applied to the pad, the well control signal VFWC may be set to the input stage supply voltage VDDO, whereas when a logic high value (e.g., a low voltage LV), is applied to the pad, the node of the well control signal VFWC may float and may be maintained at the voltage of the well control signal VFWC that was set when 0 V was applied through the pad (e.g., at the input stage supply voltage VDDO), or may be set to a voltage slightly higher than the input stage supply voltage VDDO.

Figure 12:
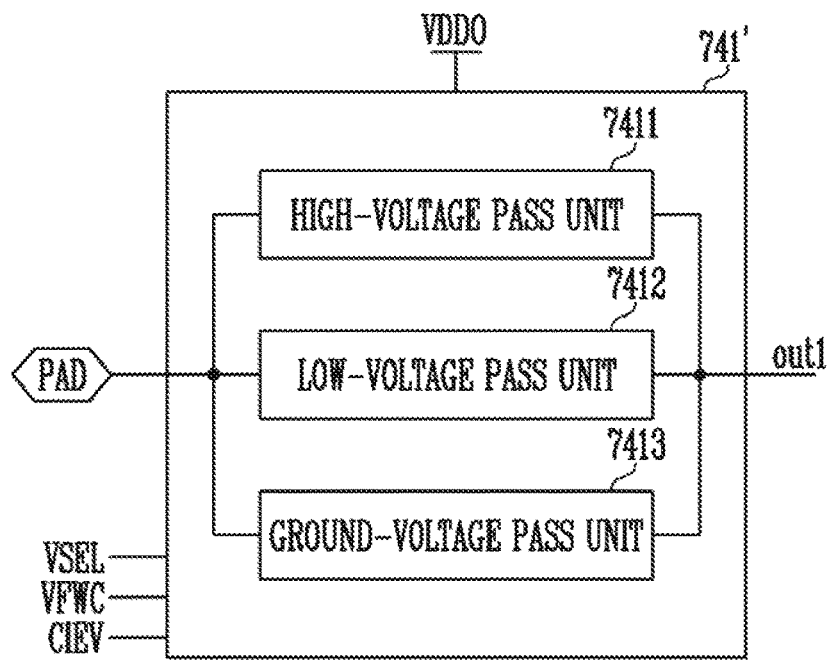
FIGS. 12 and 13 are diagrams illustrating a high-voltage protection unit of FIG. 7.
Figure 13:
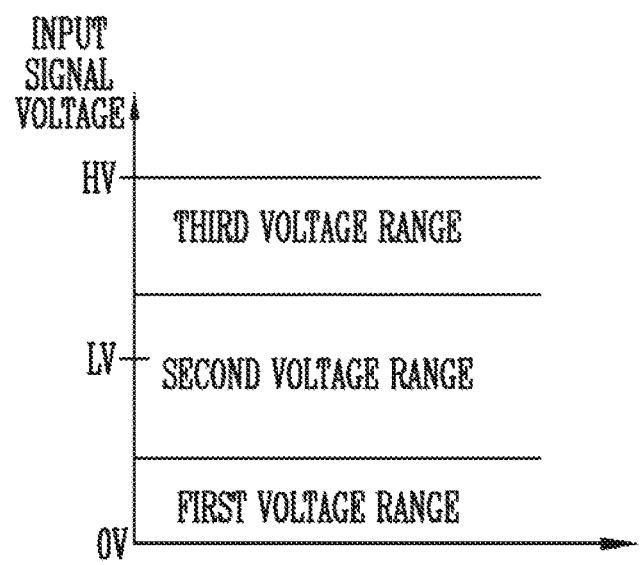

FIGS. 12 and 13 are diagrams illustrating the high-voltage protection unit of FIG. 7.

Referring to FIG. 12, the high-voltage protection unit 741' may include a high-voltage pass unit 7411, a low-voltage pass unit 7412, and a ground-voltage pass unit 7413. The high-voltage pass unit 7411, the low-voltage pass unit 7412, and the ground-voltage pass unit 7413 may be coupled in common and in parallel to the pad, and may also be coupled in common to a node of a first output signal out1.

When a high voltage (HV) is applied through the pad, that is, when a voltage higher than the input stage supply voltage VDDO is applied through the pad, the high-voltage pass unit 7411 may generate a first output signal out1 having a voltage lower than the high voltage. Here, the low-voltage pass unit 7412 and the ground-voltage pass unit 7413 may be controlled such that a leakage current between the pad and the node of the input stage supply voltage VDDO, and a leakage current between the pad and the node of the first output signal out1 do not occur, respectively. Further, transistors of the low-voltage pass unit 7412 and the ground-voltage pass unit 7413 may be controlled such that they are operated within a reliable operating voltage range.

When a low voltage (LV) is applied through the pad, that is, when a voltage similar to the input stage supply voltage VDDO is applied through the pad, the low-voltage pass unit 7412 may transfer this voltage or the input stage supply voltage VDDO to the node of the first output signal out1. Here, the high-voltage pass unit 7411 and the ground-voltage pass unit 7413 may be controlled such that a leakage current between the pad and the node of the input stage supply voltage VDDO, and a leakage current between the pad and the node of the first output signal out1, respectively, do not occur. Further, the transistors of the high-voltage pass unit 7411 and the ground-voltage pass unit 7413 may be controlled such that they are operated within a reliable operating voltage range.

When a ground voltage GND or a voltage slightly higher than the ground voltage is applied through the pad, the ground-voltage pass unit 7413 may transfer the ground voltage or the slightly higher voltage to the node of the first output signal out1.

Referring to FIG. 13, when the voltage of the input signal applied through the pad falls within a first voltage range including the ground voltage, the high-voltage protection unit 741' may transfer the input signal or the ground voltage to the node of the first output signal out1 through the ground-voltage pass unit 7413. When the voltage of the input signal applied through the pad falls within a second voltage range including a low voltage (e.g., the input stage supply voltage VDDO), the high-voltage protection unit 741' may transfer the input signal or the input stage supply voltage VDDO to the node of the first output signal out1 via the low-voltage pass unit 7412. Further, when the voltage of the input signal applied through the pad falls within a third voltage range including a high voltage, the high-voltage protection unit 741' may generate a first output signal out1 having a voltage lower than the voltage of the input signal through the high-voltage pass unit 7411, and may transfer the first output signal out1 to the node of the first output signal out1 or may transfer the input stage supply voltage VDDO to the node of the first output signal out1.

Figure 14:
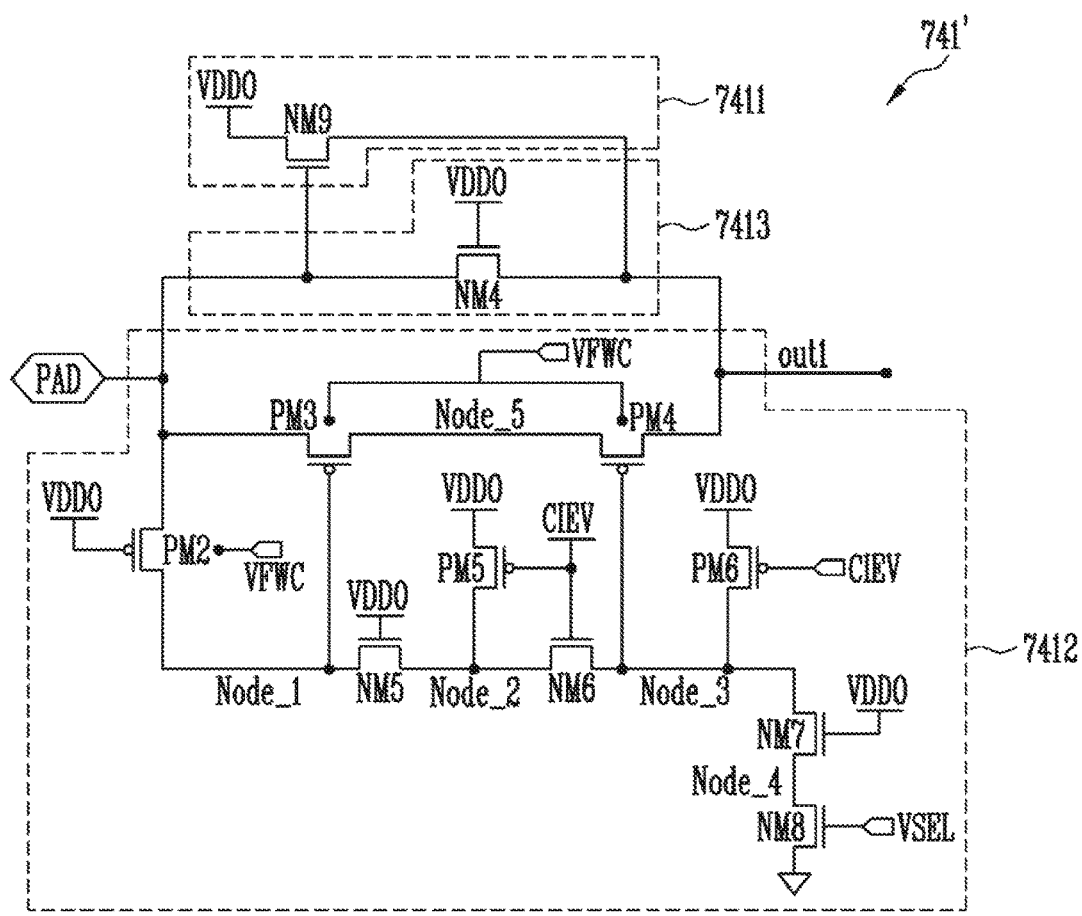
FIG. 14 is a diagram illustrating in detail the high-voltage protection unit of FIG. 12.
Figure 15:
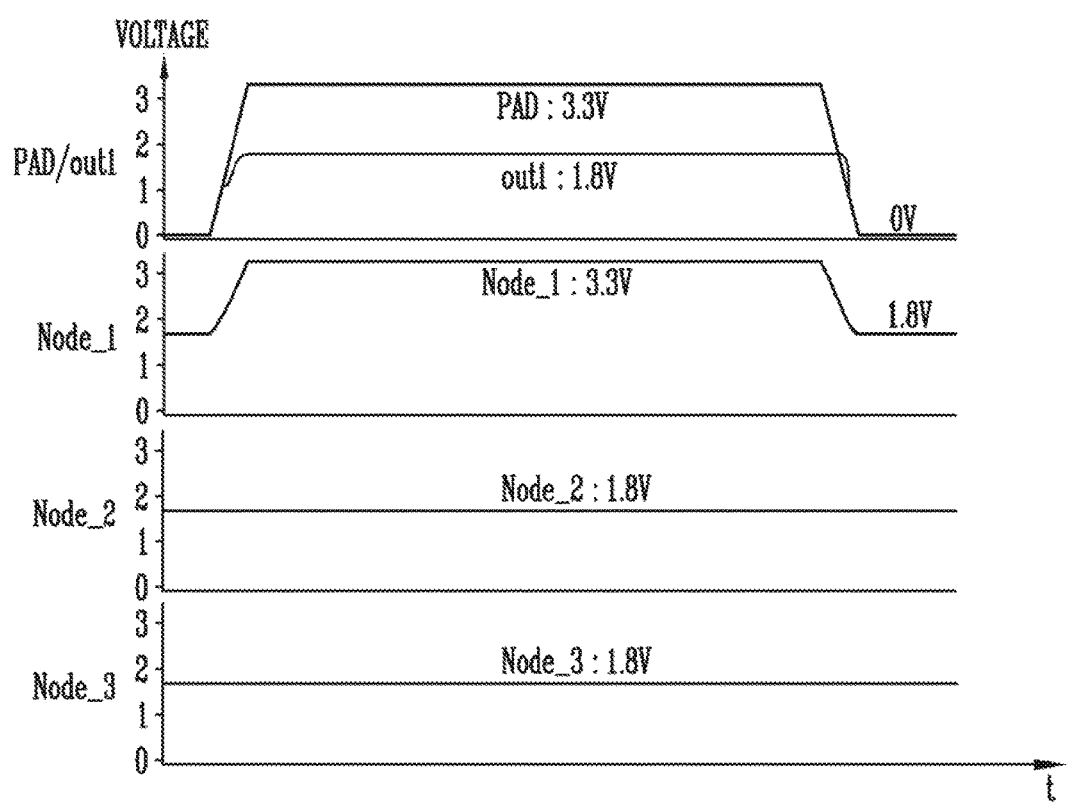
FIGS. 15 and 16 are diagrams for describing the operation of the high-voltage protection unit of FIG. 14 according to an embodiment of the present disclosure.
Figure 16:
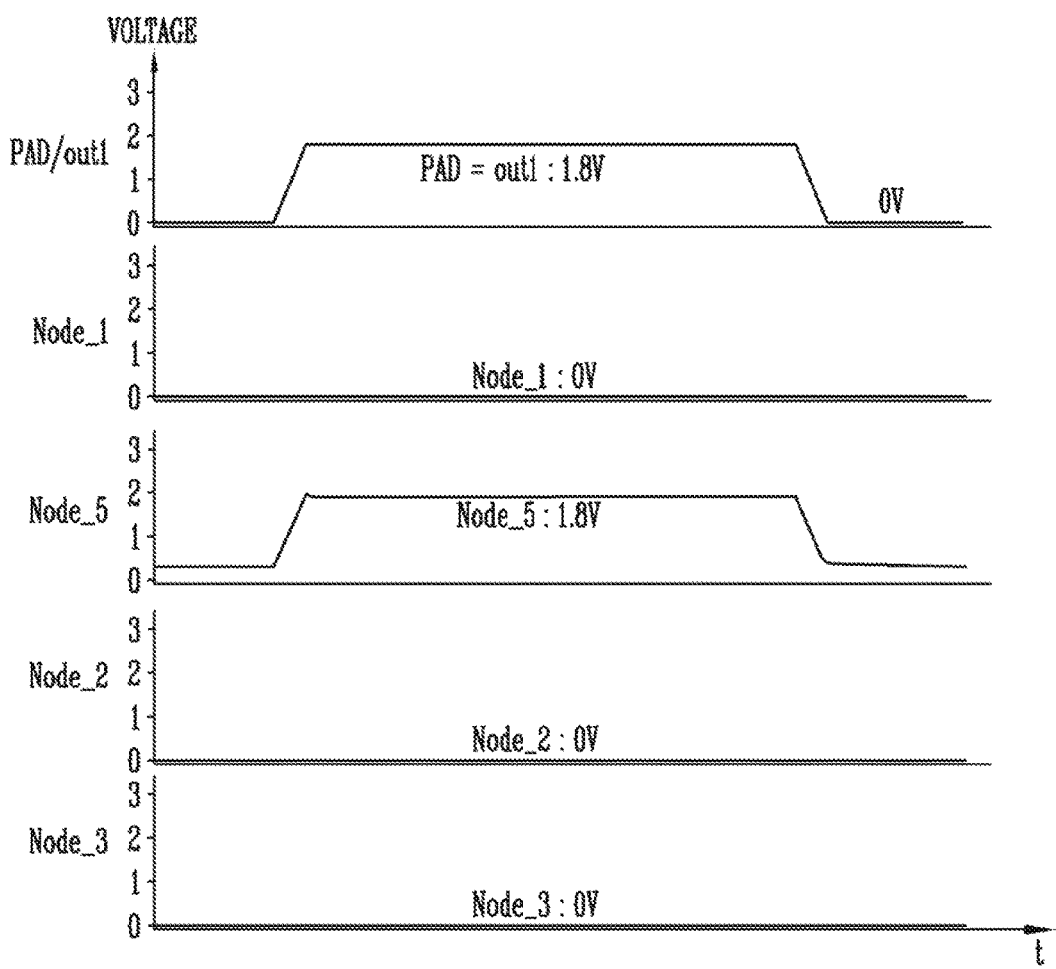

FIG. 14 is a diagram for describing an exemplary configuration of the high-voltage protection unit of FIG. 12. FIGS. 15 and 16 are diagrams for describing the operation of the high-voltage protection unit of FIG. 14 according to an embodiment of the present disclosure.

Referring to FIGS. 14 and 15, the operation of the high-voltage protection unit 741', assuming that a high-voltage (HV) input signal is applied through the pad, is illustrated. As described above with reference to FIGS. 12 and 13, when a high-voltage (HV) input signal is applied through the pad, the high-voltage pass unit 7411 may transfer either a voltage lower than the high voltage or the input stage supply voltage VDDO to the node of the first output signal out1. When the voltage swing of the input signal applied through the pad is a high voltage (HV) swing, the voltage selection signal VSEL may have a logic low value (e.g., 0 V), as described above with reference to FIG. 8. Further, the protection control signal CIEV may have a logic low value (e.g., 0 V).

When a high voltage HV (e.g., 3.3 V) is applied through the pad, the operation of the high-voltage pass unit 7411 is described below. First, a ninth N-type transistor NM9 may be turned on in response to the input signal applied to the pad, and, consequently, the voltage of the first output signal out1 may be a protection voltage, that is, the input stage supply voltage VDDO. The input stage supply voltage VDDO may be, for example, 1.8 V.

When a high voltage HV (e.g., 3.3 V) is applied through the pad, the voltages of both the drain and source of a fourth N-type transistor NM4 of the ground-voltage pass unit 7413 are 1.8 V or 3.3 V, and thus the fourth N-type transistor NM4 may be turned off. As a result, a leakage current between the pad and the node of the first output signal out1 may not occur. Further, the fourth N-type transistor NM4 may be operated such that the drain-source voltage difference, the gate-source voltage difference, and the gate-drain voltage difference thereof fall within the reliable operating voltage range of the transistor.

When a high voltage HV (e.g., 3.3 V) is applied through the pad, the operation of the low-voltage pass unit 7412 is described below. A second P-type transistor PM2 may be turned on, and, as a result, a first node Node_1 may be set to a high voltage HV (e.g., 3.3 V). A third P-type transistor PM3 may be turned off in response to the voltage of the first node Node_1, thus preventing a leakage current from occurring between the pad and the node of the first output signal out1 through the third P-type transistor PM3. In this case, the protection control signal CIEV may be 0 V, and a fifth P-type transistor PM5 may be turned on. Consequently, the voltage of a second node Node_2 may be set to 1.8 V. Therefore, the voltages of both the drain and source of a fifth N-type transistor NM5 may be 3.3 V or 1.8 V, and then the fifth N-type transistor NM5 may be turned off. A third node Node_3 may be set to 1.8 V because a sixth P-type transistor PM6 is turned on. In other words, the transistors of the low-voltage pass unit 7412, which includes the second P-type transistor PM2, the third P-type transistor PM3, and the fifth N-type transistor NM5, may be operated within the reliable operating voltage range. Further, the well control signal VFWC may be set to 3.3 V, as described above with reference to FIGS. 9 to 11. Consequently, a leakage current between the pad and the well of the third P-type transistor PM3 may not occur.

As described above with reference to FIGS. 12 and 13, when an input signal at ground voltage is applied through the pad, the input signal may be transferred as the first output signal out1 through the ground-voltage pass unit 7413. This operation is described in detail below.

Referring to FIGS. 14 and 15, when the voltage swing of the input signal applied through the pad is a high voltage (HV) swing, the operation of the ground-voltage pass unit 7413, assuming that 0 V is applied through the pad, is described below.

The fourth N-type transistor NM4 of the ground-voltage pass unit 7413 may be turned on, and the first output signal out1 may be set to 0 V. For example, when 0.1 V that falls within the first voltage range of FIG. 13 is applied through the pad, the first output signal out1 may be set to 0.1 V, which is similar to the input signal.

In this case, the ninth N-type transistor NM9 of the high-voltage pass unit 7411 may be turned off, and thus a leakage current between the node of the input stage supply voltage VDDO and the node of the first output signal out1 through the ninth N-type transistor NM9 may not occur.

In this case, the operation of the low-voltage pass unit 7412 is described below. Since the protection control signal CIEV is 0V, the fifth P-type transistor PM5 and the sixth P-type transistor PM6 are turned on, and thus the second node Node_2 and the third node Node_3 may be set to the input stage supply voltage VDDO (e.g., 1.8 V). In response to the voltage of the third node Node_3, a fourth P-type transistor PM4 may be turned off. The well control signal VFWC may be set to 1.8 V, as described above with reference to FIGS. 9 to 11. Here, since the voltage of the pad is 0 V, a leakage current between the pad and the well of the third P-type transistor PM3 may not occur.

Referring to FIGS. 14 and 16, the operation of the high-voltage protection unit 741', assuming that an input signal having a low voltage (LV) swing is applied through the pad, is illustrated. As described above with reference to FIGS. 12 and 13, when a low-voltage (LV) input signal is applied through the pad, the input signal may be transferred as the first output signal out1 through the low-voltage pass unit 7412. When the voltage swing of the input signal applied through the pad is a low voltage (LV) swing, the voltage selection signal VSEL may be a logic high value (e.g., 1.8 V), as described above with reference to FIG. 8. Further, the protection control signal CIEV may be a logic high value (e.g., 1.8 V).

First, the operation of the low-voltage pass unit 7412, assuming that a low voltage LV (e.g., 1.8 V) is applied through the pad, is described below. As described above with reference to FIGS. 8 to 12, when a low voltage LV (e.g., 1.8 V) is applied through the pad, the voltages of both the voltage selection signal VSEL and the protection control signal CIEV are 1.8 V. Accordingly, the seventh N-type transistor NM7, the eighth N-type transistor NM8, and the sixth N-type transistor NM6 are turned on, and the sixth P-type transistor PM6 is turned off, and thus the voltages of the third node Node_3 and the second node Node_2 may be set to 0 V. Further, since the second P-type transistor PM2 is turned off, the first node Node_1 may also be set to 0 V. Consequently, when 1.8 V is applied through the pad, the voltage of the first output signal out1 may be set to 1.8 V through the third P-type transistor PM3 and the fourth P-type transistor PM4. In this case, as described above with reference to FIGS. 9 to 11, the well control signal VFWC may be set to 1.8 V or a voltage slightly higher than 1.8 V. Here, since the voltage of the pad is 1.8 V, a leakage current between the pad and the well of the third P-type transistor PM3 may not occur.

When a low voltage LV (e.g., 1.8 V) is applied through the pad, the voltages of both the drain and source of the fourth N-type transistor NM4 of the ground-voltage pass unit 7413 are 1.8 V, and thus a leakage current between the pad and the node of the first output signal out1 may not occur. Further, the fourth N-type transistor NM4 may be operated within a reliable operating voltage range.

When the low voltage LV (e.g., 1.8 V) is applied through the pad, the voltages of both the drain and source of the ninth N-type transistor NM9 of the high-voltage pass unit 7411 are 1.8 V, and thus a leakage current between the node of the input stage supply voltage VDDO and the node of the first output signal out1 may not occur. Further, the ninth N-type transistor NM9 may be operated within a reliable operating voltage range.

The operation of the ground-voltage pass unit 7413, assuming that the voltage swing of the input signal is a low voltage (LV) swing, and 0 V is applied through the pad, is described below. The fourth N-type transistor NM4 may be turned on, and the first output signal out1 may be set to 0 V.

Here, the ninth N-type transistor NM9 of the high-voltage pass unit 7411 may be turned off, and thus a leakage current between the node of the input stage supply voltage VDDO and the node of the first output signal out1 through the ninth N-type transistor NM9 may not occur.

In this case, the operation of the low-voltage pass unit 7412 is described below. Since the voltages of both the voltage selection signal VSEL and the protection control signal CIEV are 1.8 V, the seventh N-type transistor NM7, the eighth N-type transistor NM8, and the sixth N-type transistor NM6 may be turned on, and the sixth P-type transistor PM6 may be turned off, and thus the voltages of the third node Node_3 and the second node Node_2 may be set to 0 V. Further, since the second P-type transistor PM2 is in a turned-off state, the voltage of the first node Node_1 may also be set to 0 V. In this case, as described above with reference to FIGS. 9 and 11, the well control signal VFWC may be set to 1.8 V. Since the voltage of the pad is 0 V, a leakage current between the pad and the well of the third P-type transistor PM3 may not occur.

When the voltage swing of an input signal applied through the pad is a high voltage (HV) swing, the high-voltage protection unit 741' may convert the input signal to generate a first output signal out1 having the swing of the input stage supply voltage VDDO. Therefore, unlike the high-voltage protection unit 741 described above with reference to FIG. 6, the high-voltage protection unit 741' described above with reference to FIGS. 12 to 16 does not cause a leakage current in the signal inversion unit 742. In other words, when the first output signal out1 is at logic high, the first output signal out1 is set to the input stage supply voltage VDDO. Therefore, the first P-type transistor PM1 of the signal inversion unit 742 is completely turned off, which can contribute to preventing a leakage current.

When the voltage swing of the input signal applied through the pad is a low voltage (LV) swing, the high-voltage protection unit 741' may generate a first output signal out1 having a voltage swing, the magnitude of which is identical to that of the low voltage (LV). Consequently, as described above, the first output signal out1 may completely turn off the first P-type transistor PM1 of the signal inversion unit 742, thus preventing a leakage current.

Figure 17:
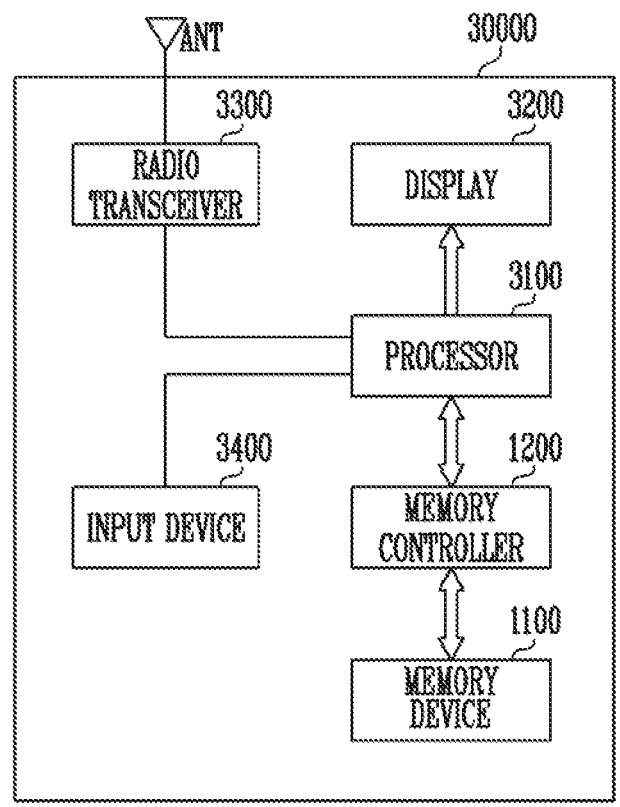
FIG. 17 is a diagram illustrating an embodiment of a memory system having the memory device of FIG. 1.

FIG. 17 is a diagram illustrating an embodiment of a memory system including the memory device illustrated in FIG. 1.

Referring to FIG. 17, a memory system 30000 may be embodied in a cellular phone, a smartphone, a tablet PC, a personal digital assistant (PDA) or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be outputted through a display 3200 under the control of the memory controller 1200.

A radio transceiver 3300 may send and receive radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal outputted from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 1200, data outputted from the radio transceiver 3300, or data outputted from the input device 3400 is outputted through the display 3200.

In an embodiment, the memory controller 1200 capable of controlling the operation of the memory device 1100 may be implemented as a part of the processor 3100 or a chip provided separately from the processor 3100.

Figure 18:
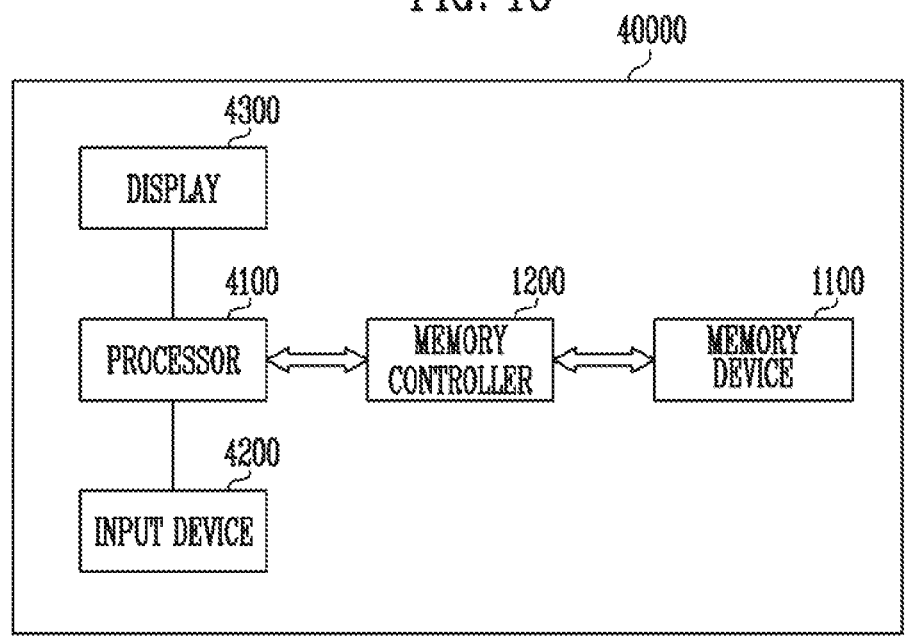
FIG. 18 is a diagram illustrating an embodiment of a memory system having the memory device of FIG. 1.

FIG. 18 is a diagram illustrating an embodiment of a memory system including the memory device illustrated in FIG. 1.

Referring to FIG. 18, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data inputted from an input device 4200. For example, the input device 4200 may be implemented as a point device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 19:
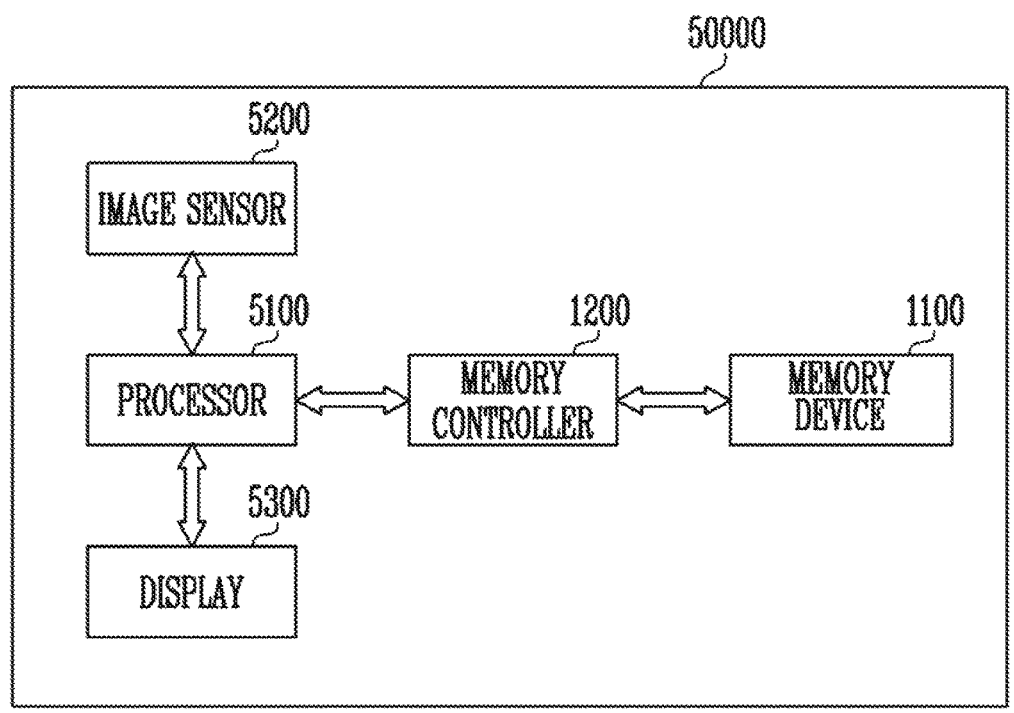
FIG. 19 is a diagram illustrating an embodiment of a memory system having the memory device of FIG. 1.

FIG. 19 is a diagram illustrating an embodiment of a memory system including the memory device illustrated in FIG. 1.

Referring to FIG. 19, a memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be outputted through a display 5300 or stored in the memory device 1100 through the memory controller 1200. Data stored in the to memory device 1100 may be outputted through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100.

Figure 20:
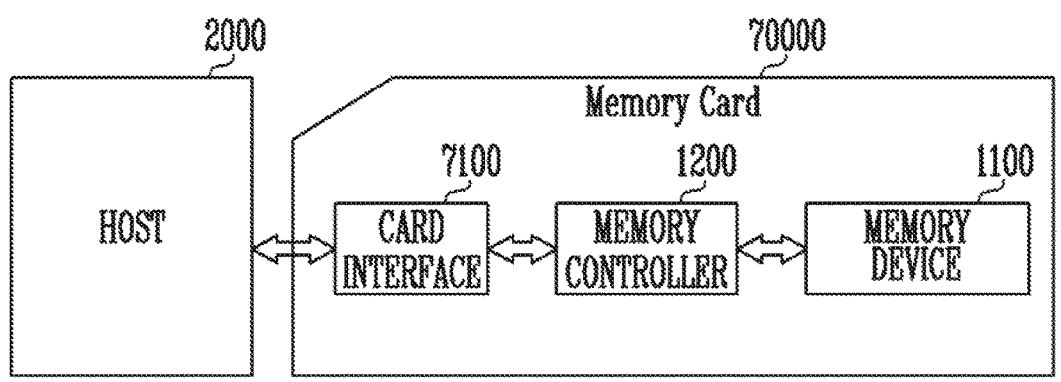
FIG. 20 is a diagram illustrating an embodiment of a memory system having the memory device of FIG. 1.

FIG. 20 is a diagram illustrating an embodiment of a memory system including the memory device illustrated in FIG. 1.

Referring to FIG. 20, a memory system 70000 may be embodied in a memory card or a smart card. The memory system 70000 may include the memory device 1100, a memory controller 1200, and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 2000 and the memory controller 1200 according to a protocol of the host 2000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

The present disclosure may provide an input buffer circuit of a memory system and a method of operating the input buffer circuit, which may be stably operated even for an input signal having a voltage higher than an input stage supply voltage, thus improving the reliability of a signal input operation of a memory system.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An input buffer circuit, comprising:
    a high-voltage protection unit coupled to a pad and comprising a low-voltage pass unit and a high-voltage pass unit that are coupled in common and in parallel to an output signal node,
    wherein the low-voltage pass unit is configured to transfer a first voltage to the output signal node without a leakage current, when the first voltage falling within a first voltage range is applied through the pad, and
    wherein the high-voltage pass unit is configured to transfer a third voltage lower than a second voltage to the output signal node, when the second voltage falling within a second voltage range higher than the first voltage range is applied through the pad.

2. The input buffer circuit according to claim 1, wherein the high-voltage protection unit uses an input stage supply voltage as a supply voltage,
    the input stage supply voltage falls within the first voltage range, and
    the third voltage is identical to the input stage supply voltage.

3. The input buffer circuit according to claim 2, wherein the high-voltage protection unit further comprises a ground-voltage pass unit, and
    the ground-voltage pass unit is configured to transfer a fourth voltage to the output signal node, when the fourth voltage falling within a third voltage range lower than the first voltage range is applied through the pad.

4. The input buffer circuit according to claim 3, wherein the third voltage range includes a ground voltage.

5. The input buffer circuit according to claim 2, wherein the high-voltage protection unit further comprises a plurality of transistors, and
    a drain-source voltage difference, a gate-drain voltage difference, and a gate-source voltage difference of each of the plurality of transistors do not exceed 1.1 times the input stage supply voltage, when the second voltage is applied through the pad.

6. The input buffer circuit according to claim 2, further comprising a well voltage generation unit,
wherein the well voltage generation unit is configured to variably control a well voltage of at least one first-type transistor included in the high-voltage protection unit based on a voltage applied through the pad.

7. The input buffer circuit according to claim 6, wherein the well voltage of the at least one first-type transistor included in the well voltage generation unit is varied based on the voltage applied through the pad.

8. The input buffer circuit according to claim 2, wherein the high-voltage protection unit is controlled in response to a voltage selection signal, and
the voltage selection signal is varied depending on a magnitude of a voltage swing of a signal applied through the pad.

9. The input buffer circuit according to claim 2, further comprising a signal inversion unit coupled to the output signal node,
wherein the signal inversion unit includes a first-type transistor configured to turn off in response to the third voltage.

10. A memory system, comprising:
an input buffer circuit configured to receive an input signal from a host through a pad,
wherein the input buffer circuit comprises a high-voltage protection unit and a well voltage generation unit that use an input stage supply voltage as a supply voltage,
wherein the high-voltage protection unit outputs the input stage supply voltage when a voltage of the input signal is a first voltage higher than the supply voltage, and
the well voltage generation unit variably controls a well voltage of at least one first-type transistor included in the high-voltage protection unit based on the voltage of the input signal.

11. The memory system according to claim 10, wherein the high-voltage protection unit outputs the input signal via a first transistor when the voltage of the input signal is a second voltage lower than the first voltage.

12. The memory system according to claim 11, wherein each of the high-voltage protection unit and the well voltage generation unit comprises a plurality of transistors, and
a drain-source voltage difference, a gate-drain voltage difference, and a gate-source voltage difference of each of the plurality of transistors do not exceed 1.1 times the input stage supply voltage, when the voltage of the input signal is the first voltage.

13. The memory system according to claim 11, wherein, when the voltage of the input signal is the second voltage, the well of the at least one P-type transistor included in the high-voltage protection unit floats.

14. The memory system according to claim 11, wherein the high-voltage protection unit is configured to, when the voltage of the input signal is a third voltage lower than the second voltage, output the input signal via a second transistor.

15. The memory system according to claim 13, wherein, when the voltage of the input signal is the first voltage, a well voltage of the first transistor is the first voltage.

16. A semiconductor device, comprising:
an input buffer circuit configured to receive an input signal from an external device through a pad and comprising a high-voltage pass unit, a low-voltage pass unit, and a ground-voltage pass unit that are coupled in common and in parallel to an output signal node,
wherein the high-voltage pass unit is configured to, when a voltage of the input signal falls within a third voltage range, output a protection voltage lower than the first voltage to the output signal node,
wherein the low-voltage pass unit is configured to, when the voltage of the input signal falls within a second voltage range lower than the third voltage range, transfer the input signal to the output signal node without a leakage current, and
wherein the ground-voltage pass unit is configured to, when the voltage of the input signal falls within a first voltage range lower than the second voltage range, transfer the input signal to the output signal node.

17. The semiconductor device according to claim 16, wherein
the input buffer circuit uses an input stage supply voltage as a supply voltage, and
the protection voltage is identical to the input stage supply voltage.

18. The semiconductor device according to claim 17, wherein a drain-source voltage difference, a gate-drain voltage difference, and a gate-source voltage difference of each of transistors included in the input buffer circuit do not exceed 1.1 times the input stage supply voltage, when the voltage of the input signal falls within the third voltage range.

19. The semiconductor device according to claim 16, wherein
the input buffer circuit further comprises a well voltage generation unit, and
the well voltage generation unit is configured to variably control a well voltage of at least one first-type transistor included in the low-voltage pass unit based on the voltage of the input signal.

20. The semiconductor device according to claim 19, wherein
the low-voltage pass unit is controlled in response to a voltage selection signal, and the voltage selection signal is varied depending on a magnitude of a voltage swing of the input signal.

* * * * *